US009245934B2

(12) United States Patent
Chung et al.

(10) Patent No.: US 9,245,934 B2
(45) Date of Patent: Jan. 26, 2016

(54) ORGANIC LIGHT-EMITTING DISPLAY APPARATUS HAVING BI-DIRECTIONAL LIGHT EMISSION AND METHOD OF MANUFACTURING THE SAME

(71) Applicant: SAMSUNG DISPLAY CO., LTD., Yongin, Gyeonggi-Do (KR)

(72) Inventors: Jin-Koo Chung, Yongin (KR); Sang-Hoon Yim, Yongin (KR); Jun-Ho Choi, Yongin (KR); Kyung-Ho Kim, Yongin (KR); Seong-Min Kim, Yongin (KR); Kwan-Hyun Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/336,550

(22) Filed: Jul. 21, 2014

(65) Prior Publication Data
US 2015/0048335 A1 Feb. 19, 2015

(30) Foreign Application Priority Data
Aug. 16, 2013 (KR) .......................... 10-2013-0097318

(51) Int. Cl.
H01L 27/32 (2006.01)
H01L 51/52 (2006.01)
H01L 51/50 (2006.01)
H01L 51/00 (2006.01)

(52) U.S. Cl.
CPC .......... H01L 27/326 (2013.01); H01L 27/3267 (2013.01); H01L 51/5056 (2013.01); H01L 51/5088 (2013.01); H01L 51/5206 (2013.01); H01L 51/5221 (2013.01); H01L 51/0058 (2013.01); H01L 51/0067 (2013.01); H01L 51/0081 (2013.01); H01L 2251/5353 (2013.01)

(58) Field of Classification Search
CPC .............. H01L 27/326; H01L 51/5056; H01L 51/5088; H01L 51/5206; H01L 51/5221; H01L 51/0067
See application file for complete search history.

(56) References Cited

U.S. PATENT DOCUMENTS

| 7,170,225 B2 * | 1/2007 | Han et al. ....................... 313/504 |
| 7,199,520 B2 * | 4/2007 | Fujii et al. ..................... 313/506 |
| 7,230,374 B2 * | 6/2007 | Suh et al. ....................... 313/504 |
| 7,250,728 B2 * | 7/2007 | Chen et al. .................. 315/169.1 |

(Continued)

FOREIGN PATENT DOCUMENTS

| JP | 2007-149699 A | 6/2007 |
| KR | 10-2005-0111488 A | 11/2005 |

(Continued)

Primary Examiner — Ida M Soward
(74) Attorney, Agent, or Firm — Lee & Morse, P.C.

(57) ABSTRACT

An organic light-emitting display apparatus includes a plurality of pixels, a plurality of first electrodes, a plurality of second electrodes, an intermediate layer, a third electrode, an auxiliary layer, and a fourth electrode. Each pixel includes a first region that emits light in a first direction and a second region that emits light in a second direction that is opposite to the first direction. The first electrodes are respectively located in the first region of each of the pixels. The second electrodes are respectively located in the second region of each of the plurality of pixels. The intermediate layer is on the plurality of first electrodes and the plurality of second electrodes, and includes an organic emission layer. The third electrode is on the intermediate layer and in the first and second regions. The fourth electrode is in the first region and contacts the third electrode.

33 Claims, 12 Drawing Sheets

(56) References Cited

U.S. PATENT DOCUMENTS

| | | | |
|---|---|---|---|
| 7,292,296 B2* | 11/2007 | Kanbe et al. | 349/114 |
| 7,333,077 B2* | 2/2008 | Koyama et al. | 345/76 |
| 7,586,254 B2* | 9/2009 | Kwak et al. | 313/504 |
| 7,622,863 B2* | 11/2009 | Seo et al. | 313/506 |
| 8,193,017 B2 | 6/2012 | Kim et al. | |
| 8,860,027 B2* | 10/2014 | Chung et al. | 257/59 |
| 2005/0258744 A1 | 11/2005 | Kwak et al. | |
| 2006/0038752 A1 | 2/2006 | Winters | |
| 2006/0097631 A1* | 5/2006 | Lee | 313/504 |
| 2007/0178224 A1 | 8/2007 | Fujii et al. | |
| 2011/0148944 A1* | 6/2011 | Kobayashi | 345/690 |
| 2011/0205468 A1* | 8/2011 | Hirakata et al. | 349/95 |
| 2011/0272675 A1 | 11/2011 | Chung et al. | |
| 2012/0080680 A1* | 4/2012 | Choi et al. | 257/59 |
| 2012/0104422 A1 | 5/2012 | Lee et al. | |
| 2012/0313099 A1 | 12/2012 | Chung et al. | |
| 2013/0176196 A1* | 7/2013 | Yamazaki et al. | 345/82 |
| 2013/0187131 A1 | 7/2013 | CHUNG et al. | |
| 2015/0144973 A1* | 5/2015 | Anzai et al. | 257/88 |

FOREIGN PATENT DOCUMENTS

| | | |
|---|---|---|
| KR | 10-2011-0116255 A | 10/2011 |
| KR | 10-2012-0044876 A | 5/2012 |
| KR | 10-1146988 B | 5/2012 |
| KR | 10-2012-0134464 A | 12/2012 |
| KR | 10-1275810 B1 | 6/2013 |

* cited by examiner

ORGANIC LIGHT-EMITTING DISPLAY APPARATUS HAVING BI-DIRECTIONAL LIGHT EMISSION AND METHOD OF MANUFACTURING THE SAME

CROSS-REFERENCE TO RELATED APPLICATION

The present application claims priority under 35 U.S.C. §119 to Korean Patent Application No. 10-2013-0097318, filed on Aug. 16, 2013, in the Korean Intellectual Property Office, and entitled: "Organic Light-Emitting Display Apparatus and Method Of Manufacturing Same," which is incorporated by reference herein in its entirety.

BACKGROUND

1. Field

Embodiments relate to an organic light-emitting display apparatus and a method of manufacturing the same.

2. Description of the Related Art

Organic light-emitting display (OLED) apparatuses have attracted attention for solving disadvantages associated with liquid crystal display apparatuses. OLED devices can be driven at a low voltage, be easily formed to be thin, have a wide angle of viewing, have quick response speeds, and the like. Unlike the liquid display apparatus, the organic light-emitting display apparatus allows for a dual emission type display apparatus.

SUMMARY

An organic light-emitting display apparatus may include a plurality of pixels, a plurality of first electrodes, a plurality of second electrodes, an intermediate layer, a third electrode, an auxiliary layer, and a fourth electrode. Each pixel of the plurality may include a first region that emits light in a first direction and a second region that emits light in a second direction that is opposite to the first direction. The plurality of first electrodes may be respectively located in the first region of each of the plurality of pixels. The plurality of second electrodes may be respectively located in the second region of each of the plurality of pixels. The intermediate layer may be on the plurality of first electrodes and the plurality of second electrodes, and may include an organic emission layer. The third electrode may be on the intermediate layer and in the first region and the second region. The auxiliary layer may be in the second region and not in the first region. The fourth electrode may be in the first region and contact the third electrode. The fourth electrode need not be in the second region. The fourth electrode may also be in the second region, and a thickness of a portion of the fourth electrode in the second region may be thinner than that of a portion of the fourth electrode in the first region. The portion of the fourth electrode in the second region may be on the auxiliary layer.

Each of the plurality of pixels may further include a third region in which at least a wiring electrically connected to at least one of the first electrode and the second electrode may be located, the auxiliary layer need not be disposed in the third region, and the fourth electrode may also be disposed in the third region. Each of the plurality of pixels may further include a third region in which at least a wiring electrically connected to at least one of the first electrode and the second electrode may be located, and the auxiliary layer may also be disposed in the third region. The fourth electrode may also be in the second region and the third region, and thicknesses of portions of the fourth electrode in the second region and the third region may be thinner than that of a portion of the fourth electrode in the first region. The portions of the fourth electrode in the second region and the third region may be formed on the auxiliary layer.

Each of the plurality of pixels may further include a fourth region through which external light transmits in the thickness direction of the organic light-emitting display apparatus, and the auxiliary layer may also be in the fourth region. The fourth electrode need not be in the fourth region. The fourth electrode may also be in the second region and the fourth region, and thicknesses of portions of the fourth electrode in the second region and the fourth region may be thinner than that of the portion of the fourth electrode in the first region. The portions of the fourth electrode in the second region and the fourth region may be on the auxiliary layer. A thickness of the fourth electrode may be thicker than that of the third electrode.

An adhesive force of the fourth electrode to the third electrode may be stronger than that to the auxiliary layer. The auxiliary layer may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA[4,4,4-tris(3-methylphenylphenylamino)triphenylamine], α-NPD(N,N'-bis(1-naphthyl)-N,N-diphenyl[1,1'-biphenyl]-4,4'-diamine), or TPD[4,4'-Bis[N-(3-methylphenyl)-N-phenylamino]biphenyl]. The fourth electrode may include magnesium (Mg).

A method of manufacturing an organic light-emitting display apparatus is provided and may include the following. A plurality of pixels may be defined, each pixel including a first region that emits light in a first direction and a second region that emits light in a second direction that is opposite to the first direction. A plurality of first electrodes may be formed respectively located in the first region of each of the plurality of pixels. A plurality of second electrodes may be formed respectively located in the second region of each of the plurality of pixels. An intermediate layer may be formed that is disposed on the plurality of first electrodes and the plurality of second electrodes and may include an organic emission layer. A third electrode may be formed on the intermediate layer in the first region and the second region by depositing a metal on the intermediate layer. An auxiliary layer may be formed on the third electrode in the second region and not in the first region. A fourth electrode may be formed on the third electrode in the first region and contacting the third electrode by depositing a metal on the third electrode.

Forming the fourth electrode may include depositing a suitable metal in the first region and the second region simultaneously so that the fourth electrode is not in the second region. Forming the fourth electrode may include depositing a suitable metal in the first region and the second region simultaneously so that the fourth electrode is also in the second region, and a thickness of a portion of the fourth electrode in the second region may be thinner than that of a portion of the fourth electrode in the first region. Forming the fourth electrode may include forming the fourth electrode on the auxiliary layer at least in the second region.

Each of the plurality of pixels may further include a third region in which at least a wiring electrically connected to at least one of the first electrode and the second electrode is located. Forming the auxiliary layer may include forming the auxiliary layer not to be in the third region, and forming the fourth electrode may include depositing a suitable metal in the first region and the third region simultaneously so that the fourth electrode is also in the third region. Each of the plurality of pixels may further include a third region in which at least a wiring electrically connected to at least one of the first electrode and the second electrode is located. Forming the auxiliary layer may include forming the auxiliary layer to be also in the third region.

Forming the fourth electrode may include depositing a suitable metal in the first region to the third region simultaneously so that the fourth electrode is also in the second region and the third region, and thicknesses of portions of the fourth electrode in the second region and the third region may be thinner than that of the portion of the fourth electrode in the first region. Forming the fourth electrode may include forming the fourth electrode on the auxiliary layer at least in the second region and the third region. Each of the plurality of pixels may further include a fourth region through which external light transmits in the thickness direction of the organic light-emitting display apparatus. Forming the auxiliary layer may include forming the auxiliary layer to be also in the fourth region.

Forming the fourth electrode may include depositing a suitable metal in the first region, the second region, and the fourth region simultaneously so that the fourth electrode is not in the fourth region. Forming the fourth electrode may include depositing a suitable metal in the first region, the second region, and the fourth region simultaneously so that the fourth electrode is also in the second region and the fourth region, and thicknesses of portions of the fourth electrode in the second region and the fourth region may be thinner than that of the portion of the fourth electrode disposed in the first region. Forming the fourth electrode may include forming the fourth electrode on the auxiliary layer at least in the second region and the fourth region.

A thickness of the fourth electrode may be thicker than that of the third electrode. An adhesive force of the fourth electrode to the third electrode may be stronger than that to the auxiliary layer. The auxiliary layer may include N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA[4,4,4-tris(3-methylphenylphenylamino)triphenylamine], α-NPD(N,N'-bis(1-naphthyl)-N,N-diphenyl[1,1'-biphenyl]-4,4'-diamine), or TPD[4,4'-Bis[N-(3-methylphenyl)-N-phenylamino]biphenyl]. The fourth electrode may include magnesium (Mg).

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
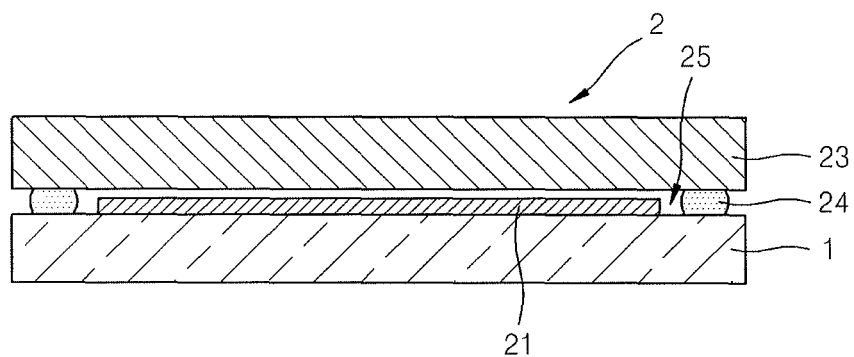
FIG. 1 illustrates a schematic cross-sectional view of an organic light-emitting display apparatus.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described, by referring to the figures, to explain aspects of the present description. Although the terms "first," "second," and the like may be used herein to describe various components, these components should not be limited by these terms. These components are only used to distinguish one component from another. As used herein, the singular forms "a," "an," and "the" are intended to include the plural forms as well, unless the context clearly indicates otherwise. The terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. Because sizes and thicknesses of components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

Figure 2:
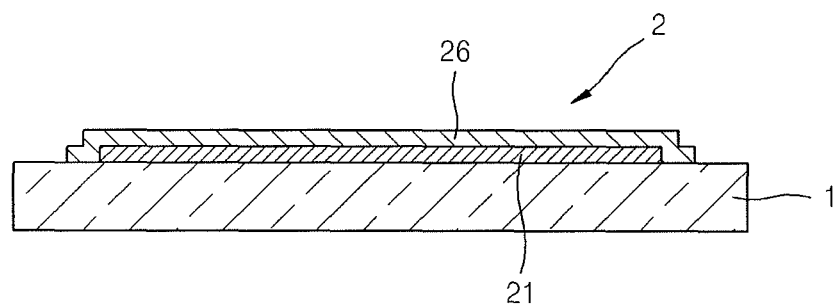
FIG. 2 illustrates a schematic cross-sectional view of an organic light-emitting display apparatus.

FIG. 1 illustrates a schematic cross-sectional view of an organic light-emitting display apparatus. Referring to FIG. 1, the organic light-emitting display apparatus may include a display unit 2 on a substrate 1. The display unit 2 may include an organic emission part 21, which is on the substrate 1, and a sealing substrate 23 that seals up the organic emission part 21. The sealing substrate 23 may block the penetrating of air and humidity into the organic emission part 21. The sealing substrate 23 may be include a transparent member to thereby pass an image generated by the organic emission part 21 therethrough. The substrate 1 and the sealing substrate 23 may be bonded by a sealing member 24 at edges thereof to thereby seal up a space 25 between the substrate 1 and the sealing substrate 23. An absorbent, a filling material, or the like may be in the space 25. The organic emission part 21 may be protected from the air by forming a thin film encapsulation layer 26 on the organic emission part 21 as shown in FIG. 2 instead of the sealing substrate 23. The thin film encapsulation layer 26 may include a plurality of inorganic layers or a combination of an inorganic layer and an organic layer.

The organic layer of the thin film encapsulation layer 26 may include a polymer and may be a single layer or a layer stack formed of any one of, for example, polyethylene terephthalate (PET), polyimide, polycarbonate (PC), epoxy, polyethylene, and polyacrylate (PAR). The organic layer may include PAR, and in detail, may include a polymerized monomer composition including a diacrylate-based monomer and a triacrylate-based monomer. The monomer composition may further include a monoacrylate-based monomer. Also, the monomer composition may further include, for example, a suitable photoinitiator, such as trimethyl benzoyl diphenyl phosphine oxide (TPO), and the like.

The inorganic layer of the thin film encapsulation layer 26 may be a single layer or a stack layer including a metal oxide or a metal nitride. The inorganic layer may include any one of silicon nitride ($SiN_x$), aluminum oxide ($Al_2O_3$), silicon oxide ($SiO_2$), and titanium oxide ($TiO_2$). The top layer of the thin film encapsulation layer 26 that is exposed to the outside may include an inorganic layer in order to prevent intrusion of moisture or air into an organic light-emitting device (OLED).

The thin film encapsulation layer 26 may include at least one sandwich structure in which at least one organic layer is inserted between at least two inorganic layers. The thin film encapsulation layer 26 may include at least one sandwich structure in which at least one inorganic layer is inserted between at least two organic layers. The thin film encapsulation layer 26 may include a sandwich structure in which at least one organic layer is inserted between at least two inorganic layers and a sandwich structure in which at least one inorganic layer is inserted between at least two organic layers. The thin film encapsulation layer 26 may include a first inorganic layer, a first organic layer, and a second inorganic layer sequentially located from the top portion of the organic emission part 21. The thin film encapsulation layer 26 may include a first inorganic layer, a first organic layer, a second inorganic layer, a second organic layer, and a third inorganic layer sequentially formed from the top portion of the organic emission part 21. The thin film encapsulation layer 26 may include a first inorganic layer, a first organic layer, a second inorganic layer, a second organic layer, a third inorganic layer, a third organic layer, and a fourth inorganic layer sequentially located from the top portion of the organic emission part 21.

A halogenized metal layer, including lithium fluoride (LiF), may be additionally included between the organic emission part 21 and the first inorganic layer. The halogenized metal layer may prevent the organic emission part 21 from being damaged when the first inorganic layer is formed in a sputtering method or a plasma deposition method. The first organic layer may be smaller than the second inorganic layer, and the second organic layer may also be smaller than the third inorganic layer. The first organic layer may be completely covered by the second inorganic layer, and the second organic layer may also be completely covered by the third inorganic layer.

Figure 3:
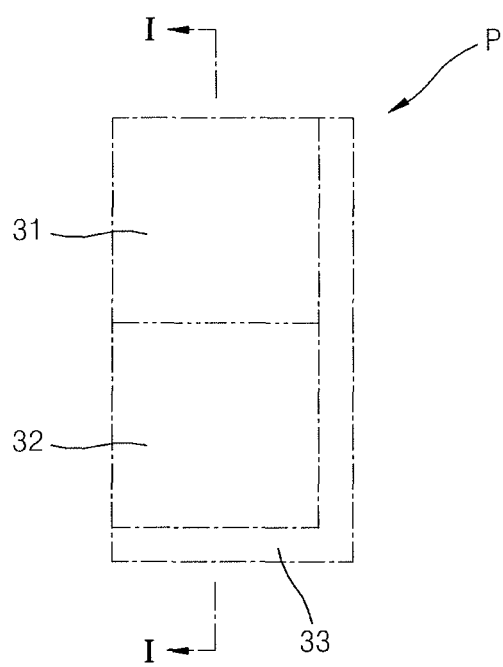
FIG. 3 illustrates a top view of a pixel in an organic emission part of the organic light-emitting display apparatus of FIG. 1 or 2.

The organic emission part 21 of FIG. 1 or 2 may include a plurality of pixels, and FIG. 3 illustrates a top view of a pixel P of the plurality of pixels. The pixel P includes a first region 31 and a second region 32, which are located adjacent to each other, and a third region 33 disposed around the first region 31 and the second region 32. The first region 31 may be a bottom emission region, and the second region 32 may be a top emission region. The third region 33 may be a region through which wirings electrically connected to the first region 31 and the second region 32 pass. The third region 33 is not necessarily disposed around the first region 31 and the second region 32 as shown in FIG. 3, and when, for example, the wirings are arranged to cross the first region 31 and/or the second region 32, the third region 33 do not have to exist as a separate region.

The pixel P shown in FIG. 3 may be, for example, a single sub-pixel in which the first region 31 and the second region 32 emit light of a single color. For example, the pixel P shown in FIG. 3 may be a single sub-pixel in which the first region 31 and the second region 32 respectively emit lights of different colors. The pixel P may be, for example, a single sub-pixel in which the first region 31 and the second region 32 emit light of a single color. The pixel P may be a sub-pixel that emits light of any one of, for example, red, green, and blue colors. The organic emission part 21 of FIG. 1 or 2 may further include a plurality of sub-pixels that emit light of the other colors of the red, green, and blue colors in addition to the pixel P shown in FIG. 3. The pixel P may be a sub-pixel that emits light of any one of, for example, red, green, blue, and white colors. The organic emission part 21 of FIG. 1 or 2 may further include a plurality of sub-pixels that emit light of the other colors of the red, green, blue, and white colors in addition to the pixel P shown in FIG. 3. The sub-pixels that emit light of the red, green, blue, and/or white colors may form a single pixel that emits light of a white color by mixing the lights. In this case, a color converting layer or a color filter that converts the white light of each pixel into a light of a predetermined color may be applied. The red, greed, blue and/or white colors are exemplary and other colors and/or combinations and/or numbers may be used. For example, any combination of other various colors, which is capable of emitting a white light, may be employed in addition to a combination of red, green, blue, and/or white colors.

Figure 4:
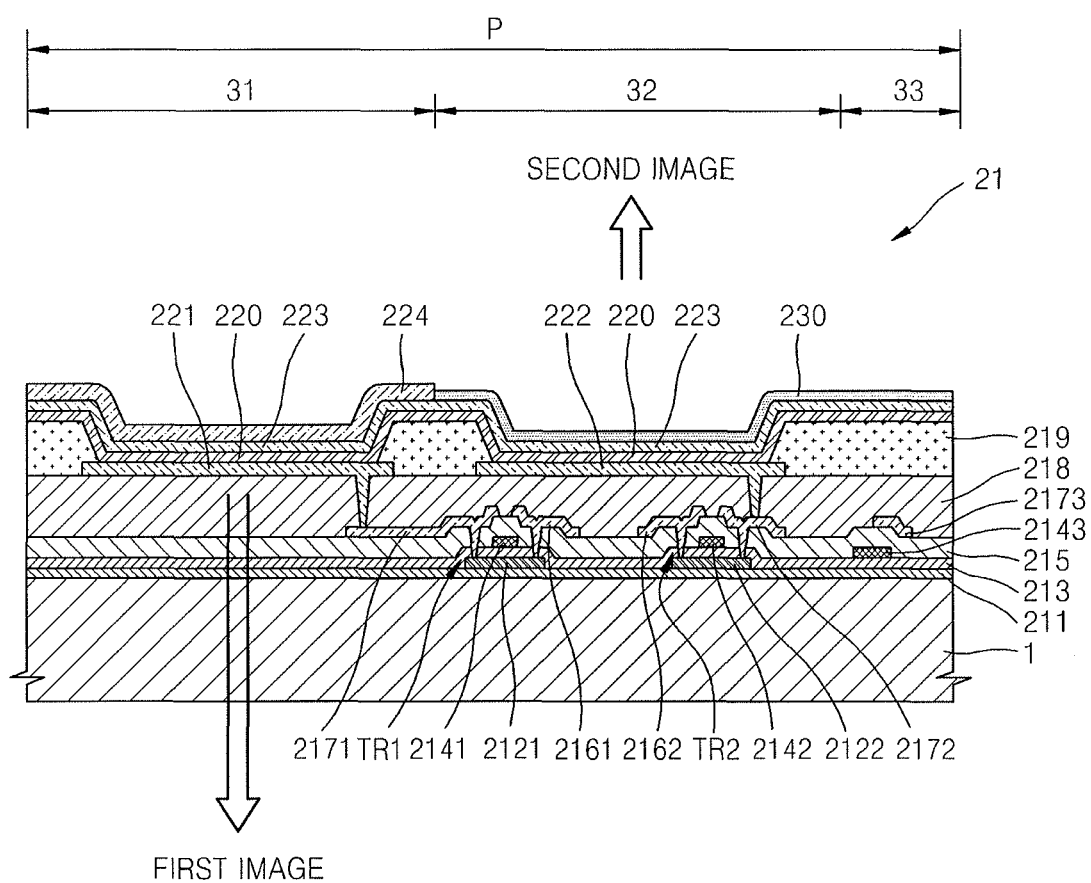
FIG. 4 illustrates a cross-sectional view along I-I of FIG. 3.

FIG. 4 illustrates a cross-sectional view along I-I of FIG. 3. Referring to FIG. 4, the first region 31 emits a first image in a first direction that is a direction towards the substrate 1, and the second region 32 emits a second image in a second direction that is opposite to the first direction. First and second OLEDs are in the first region 31 and the second region 32, respectively. The first and second OLEDs may be electrically connected to first and second thin-film transistors (TFTs) TR1 and TR2 in a pixel circuit unit, respectively. A first pixel circuit unit for the first region 31 may be excluded from a light-emitting path but located in the second region 32 to thereby prevent a decrease in emission efficiency and brightness of the first image. Because the second region 32 emits the second image in a direction opposite to the substrate 1, the first pixel circuit unit electrically connected to the first OLED in the first region 31 and a second pixel circuit unit electrically connected to the second OLED in the second region 32 may be disposed in the second region 32. For example, the first pixel circuit unit and the second pixel circuit unit may be independent pixel circuit units, and in this case, the first image and the second image may be individual images instead of the same image. A single pixel circuit unit electrically connected to the first OLED in the first region 31 and the second OLED in the second region 32 may be provided. This pixel circuit unit may be disposed in the second region 32 to thereby prevent a decrease in emission efficiency and brightness of the first image.

Figure 5:
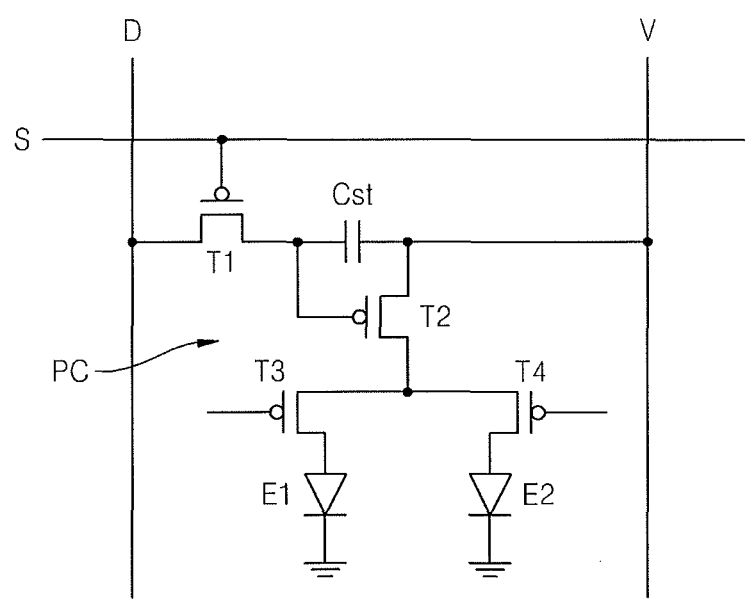
FIG. 5 illustrates a circuit diagram of a pixel circuit unit.

FIG. 5 illustrates a circuit diagram of a single pixel circuit unit PC. Referring to FIG. 5, a scan line S, a data line D, and a Vdd line V that may be a driving power line are electrically connected to the pixel circuit unit PC. Various conductive lines may be further included in addition to the scan line S, the data line D, and the Vdd line V according to a configuration of the pixel circuit unit PC. The pixel circuit unit PC may include a first TFT T1 connected to the scan line S and the data line D, a second TFT T2 connected to the first TFT T1 and the Vdd line V, and a capacitor Cst connected to the first TFT T1 and the second TFT T2. A gate electrode of the first TFT T1 may be connected to the scan line S and receives a scan signal, a first electrode thereof is connected to the data line D, and a second electrode thereof may be connected to the capacitor Cst and a gate electrode of the second TFT T2. A first electrode of the second TFT T2 may be connected to the Vdd line V and the capacitor Cst, and a second electrode thereof may be connected to first electrodes of a first emitting TFT T3 and a second emitting TFT T4. In this case, the first TFT T1 may be a switching transistor, and the second TFT T2 may be a driving transistor. A second electrode of the first emitting TFT T3 may be electrically connected to a first OLED E1 located in the first region 31, and a second electrode of the second emitting TFT T4 may be electrically connected to a second OLED E2 located in the second region 32. Gate electrodes of the first emitting TFT T3 and the second emitting TFT T4 may be electrically connected to individual light-emitting signal lines, respectively.

Although all the TFTs T1 to T4 in FIG. 5 are shown as a P type, other types and combinations thereof may be used, and at least one of the TFTs T1 to T4 may be formed as an N type. The number of TFTs and the number of capacitors may be different, for example, than the numbers shown in FIG. 5, and two or more TFTs and one or more capacitors may be further included according to pixel circuit units. According to the configuration of the pixel circuit unit PC, image information input through the data line D may be realized by the first OLED E1 when the first emitting TFT T3 is enabled and may be realized by the second OLED E2 when the second emitting TFT T4 is enabled, so that the first OLED E1 and the second OLED E2 emit different images. Top and bottom emission may be implemented through time division driving so that an image of a top emission surface and an image of a bottom emission surface are not reversed as a mirror image to each other. Of course, when the same switching signal is applied to the first emitting TFT T3 and the second emitting TFT T4 in a state where the same data signal is applied, for example, a reversed mirror image may be shown at the top or bottom surface. The pixel circuit unit PC may allow various screens to be realized in a state where the basic configuration of the first OLED E1 and the second OLED E2 is shared.

Referring back to FIG. 4, the first TFT TR1 and the second TFT TR2 may be located on the substrate 1 and may be electrically connected to a first electrode 221 located in the first region 31 and a second electrode 222 located in the second region 32, respectively. The first TFT TR1 and the second TFT TR2 may be driving TFTs of the first and second pixel circuit units, respectively. The first TFT TR1 and the second TFT TR2 may be the first emitting TFT T3 and the second emitting TFT T4 shown in FIG. 5, respectively. As shown in FIG. 4, a buffer layer 211 may be on the substrate 1, and the pixel circuit unit including the first and second TFTs TR1 and TR2 may be on the buffer layer 211. Semiconductor active layers 2121 and 2122 may be formed on the buffer layer 211.

The buffer layer 211 may include a transparent insulating material, which functions to prevent intrusion of impurity elements and planarize a surface, and may include various materials for performing these functions. For example, the buffer layer 211 may include an inorganic material, such as silicon oxide, silicon nitride, silicon oxynitride, aluminum oxide, aluminum nitride, titanium oxide, titanium nitride, or the like, an organic material, such as polyimide, polyesther, acryl, or the like, or a stacked body thereof. The buffer layer 211 may be omitted. The semiconductor active layers 2121 and 2122 may include, for example, polycrystalline silicon. The semiconductor active layers 2121 and 2122 may include an oxide semiconductor. For example, an $[(In_2O_3)_a(Ga_2O_3)_b(ZnO)_c]$ (G-I—Z—O) layer (a, b, and c are real numbers satisfying a condition of a≥0, b≥0, c≥0) may be used for the semiconductor active layers 2121 and 2122. A gate insulating layer 213 may be on the buffer layer 211 to cover the semiconductor active layers 2121 and 2122, and gate electrodes 2141 and 2142 are on the gate insulating layer 213. An interlayer insulating layer 215 may be on the gate insulating layer 213 to cover the gate electrodes 2141 and 2142, and source electrodes 2161 and 2162 and drain electrodes 2171 and 2172 may be on the interlayer insulating layer 215 to contact the semiconductor active layers 2121 and 2122 through contact holes, respectively.

The structures of the first and second TFTs TR1 and TR2 described are not mandatory, and various types of TFT structures are applicable. A first insulating layer 218 may be formed to cover the first and second TFTs TR1 and TR2. The first insulating layer 218 may include a single layer or a plurality of layers of which the top surface may be planarized. The first insulating layer 218 may include an inorganic material and/or an organic material.

A plurality of wirings including a first wiring 2143 and a second wiring 2173 may be located in the third region 33. The first wiring 2143 may be formed when the gate electrodes 2141 and 2142 are formed, and the second wiring 2173 may be formed when the source electrodes 2161 and 2162 and the drain electrodes 2171 and 2172 are formed. The first wiring 2143 and the second wiring 2173 may be various types of wirings electrically connected to the pixel circuit unit. The first electrode 221 of the first OLED electrically connected to the first TFT TR1 and the second electrode 222 of the second OLED electrically connected to the second TFT TR2 may be formed on the first insulating layer 218 as shown in FIG. 4. The first and second electrodes 221 and 222 may be formed in the shape of an island. A second insulating layer 219 may be formed on the first insulating layer 218 to cover edges of the first and second electrodes 221 and 222. The second insulating layer 219 may include an organic material, such as acryl, polyimide, or the like.

An intermediate layer 220 including an emission layer (EML) may be formed on the first and second electrodes 221 and 222, and a third electrode 223 may be formed to cover the intermediate layer 220, thereby forming the first and second OLEDs. The intermediate layer 220 may be a low-molecular organic layer or a high-molecular organic layer. When a low-molecular organic layer is used, for example, a hole injection layer (HIL), a hole transport layer (HTL), the EML, an electron transport layer (ETL), an electron injection layer (EIL), and the like may be stacked in a single or composite structure. These low-molecular organic layers may be formed in a vacuum deposition method. The EML may be independently formed for every sub-pixels of red, green, and blue colors, and the HIL, the HTL, the ETL, the EIL, and the like may be commonly formed for all sub-pixels as common layers. As shown in FIG. 4, because the first region 31 and the second region 32 are included in the pixel P forming a single sub-pixel, for example, an EML of a single color may be deposited in the first region 31 and the second region 32. The first region 31 and the second region 32 may include EMLs of different colors, respectively. The HIL may include a phthalocyanine compound, such as copper phthalocyanine (CuPc) or the like, or any of starburst-type amines, such as TCTA, m-MTDATA, and m-MTDAPB. The HTL may include N,N'-bis(3-methylphenyl)-N,N'-diphenyl-(1,1-biphenyl)-4,4'-diamine (TPD) or N,N'-di(naphthalene-1-yl)-N,N'-diphenyl benzidine (α-NPD). The EIL may include LiF, sodium chloride (NaCl), cesium fluoride (CsF), lithium oxide ($Li_2O$), barium oxide (BaO), or 8-hydroxyquinolate lithium (Liq). The ETL include tris-(8-hydroxyquinolate)aluminum (Alq3). The EML may include a host material and a dopant material. The host material may include Alq3,9,10-di(naphthalen-2-yl)anthracene (AND), 3-tert-butyl-9,10-di(naphthalen-2-yl)anthracene (TBADN), 4,4'-bis(2,2-diphenyl-ethen-1-yl)-4,4'-dimethylphenyl (DPVBi), or 4,4'-bis(2,2-diphenyl-ethene-1-yl)-4,4'-dimethylphenyl (p-DMDPVBi). The dopant material may include 4,4'-bis[4-(di-p-tolylamino)styryl]biphenyl (DPAVBi), 9,10-di(naphthalen-2-yl)anthracene (ADN), or TBADN.

The first and second electrodes 221 and 222 may function as an anode electrode, and the third electrode 223 may function as a cathode electrode, and the polarities of the first and second electrodes 221 and 222 and the third electrode 223 may be vice versa. When the first and second electrodes 221 and 222 function as anode electrodes, for example, the first and second electrodes 221 and 222 may include an indium tin oxide (ITO), an indium zinc oxide (IZO), a zinc oxide (ZnO), an indium oxide ($In_2O_3$), or the like having a large work function. The second electrode 222 located in the second region 32 that emits an image in a direction opposite to the substrate 1 may further include a reflective layer including at least one of silver, (Ag), magnesium (Mg), aluminum (Al), platinum (Pt), palladium (Pd), gold (Au), nickel (Ni), neodymium (Nd), iridium (Ir), chromium (Cr), Li, ytterbium (Yb), cobalt (Co), samarium (Sm), and calcium (Ca).

When the third electrode 223 serves as a cathode electrode, the third electrode 223 may include a metal, such as Ag, Mg, Al, Pt, Pd, Au, Ni, Nd, Ir, Cr, Li, Yb, Co, Sm, or Ca. The third electrode 223 may be provided to pass light therethrough so that the second image is smoothly emitted. The third electrode 223 may be formed as a thin film using Mg and/or a Mg alloy. The third electrode 223 may be formed as a thin film using Ag and/or an Ag alloy. Unlike the first and second electrodes 221 and 222, the third electrode 223 may be formed as a common electrode so that a common voltage may be applied to all pixels and may be formed by common deposition using an open mask without patterning per pixel. The third electrode 223 may be located in the first, second, and third regions 31, 32, and 33.

After forming the third electrode 223, an auxiliary layer 230 may be formed in the second region 32 and the third region 33. Thus, the auxiliary layer 230 may be excluded from the first region 31. The auxiliary layer 230 may be formed in the second region 32 and the third region 33 and may be excluded from the first region 31 by performing deposition using a mask. As the auxiliary layer 230, a material to which a material to be formed thereon, i.e., a metal for forming a fourth electrode 224, specifically, Mg and/or a Mg alloy, that is partially bonded may be used. For example, the auxiliary layer 230 may be formed a material including N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D] imidazole, m-MTDATA[4,4,4-tris(3-methylphenylphenylamino)triphenylamine], α-NPD(N,N'-bis(1-naphthyl)-N,N'-diphenyl[1,1'-biphenyl]-4,4'-diamine), or TPD[4,4'-Bis[N-(3-methylphenyl)-N-phenylamino]biphenyl].

After the auxiliary layer 230 patterned to be located in the second region 32 and the third region 33 and not to be located in the first region 31 is formed on the third electrode 223, the fourth electrode 224 may be formed. The fourth electrode 224 may be formed by using an open mask and commonly depositing a metal for forming the fourth electrode 224 over all pixels including the first, second, and third regions 31, 32, and 33. When the metal for forming the fourth electrode 224 is commonly deposited over all pixels by using an open mask, for example, the metal for forming the fourth electrode 224 is partially deposited on the auxiliary layer 230, but is well deposited on the third electrode 223, because an adhesive force of the fourth electrode 224 to the third electrode 223 may be stronger than that to the auxiliary layer 230.

The fourth electrode 224 may be automatically patterned to be located in the first region 31 and not to be located in the second region 32 and the third region 33. The fourth electrode 224 may be readily patterned without using a separate mask for patterning. The metal for forming the fourth electrode 224, may be, for example, Mg and/or a Mg alloy, which are partially deposited on the auxiliary layer 230. The metal for forming the fourth electrode 224 may alternatively or additionally use other metals, for example, various metals selected from Ag, Mg, Al, Pt, Pd, Au, Ni, Nd, Ir, Cr, Li, Yb, Co, Sm, and Ca may be applied to the metal for forming the fourth electrode 224 if, for example, an adhesive force thereof to the auxiliary layer 230 is weaker than that to the third electrode 223. The first and second electrodes may include the same metal or metals, and/or may include one or more different metals. The fourth electrode 224 may contact the third electrode 223 in the first region 31.

Because the third electrode 223 is formed as a thin film and is a common electrode that applies a common voltage to all pixels, when a surface resistance increases, for example, a voltage drop phenomenon may occur. Because the fourth electrode 224 contacts the third electrode 223 in the first region 31, the voltage drop phenomenon of the third electrode 223 may be reduced. The fourth electrode 224 may be formed to be thicker than the third electrode 223. Because the fourth electrode 224 is formed in the first region 31, when the first OLED in the first region 31 emits the first image in the first direction towards the substrate 1, for example, the fourth electrode 224 may function as a reflective plate, and accordingly, image quality of the first image may be much improved.

Figure 6:
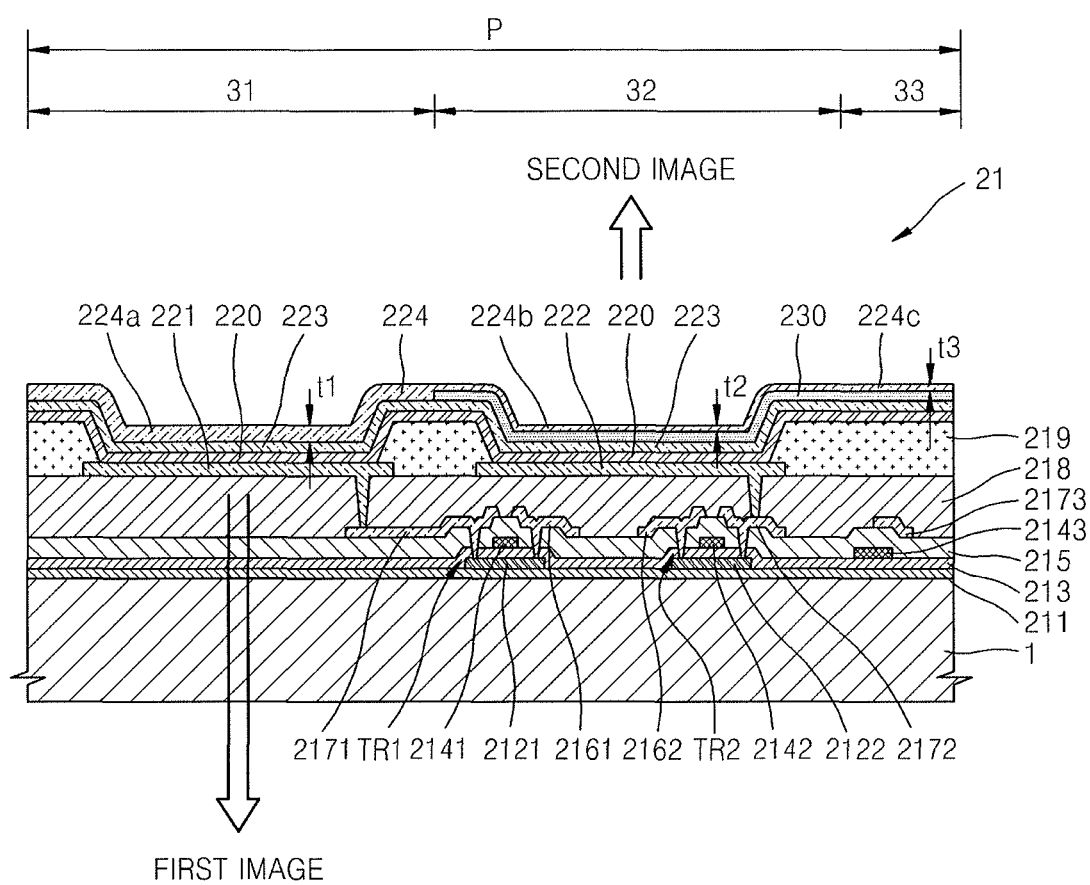
FIG. 6 illustrates a cross-sectional view along I-I of FIG. 3.

FIG. 6 illustrates a cross-sectional view along I-I of FIG. 3. Even though a material to which a metal to be formed thereon, for example, Mg and/or a Mg alloy, is partially bonded is used as the auxiliary layer 230, even a small amount of metal may be deposited on the auxiliary layer 230. If the metal for forming the fourth electrode 224 is deposited in the first, second, and third regions 31, 32, and 33 by using an open mask when the auxiliary layer 230 is formed in the second region 32 and the third region 33, for example, the fourth electrode 224 may be formed in the first, second, and third regions 31, 32, and 33 as shown in FIG. 6. In this case, even though the metal for forming the fourth electrode 224 is somewhat deposited on the auxiliary layer 230, an amount thereof may be very small, and thus, thicknesses t2 and t3 of portions 224b and 224c of the fourth electrode 224 in the second region 32 and the third region 33 may be much thinner than a thickness t1 of a portion 224a of the fourth electrode 224 in the first region 31. Thus, the transmissivity of the second image might not be significantly lowered due to the portion 224b of the fourth electrode 224 in the second region 32.

Figure 7:
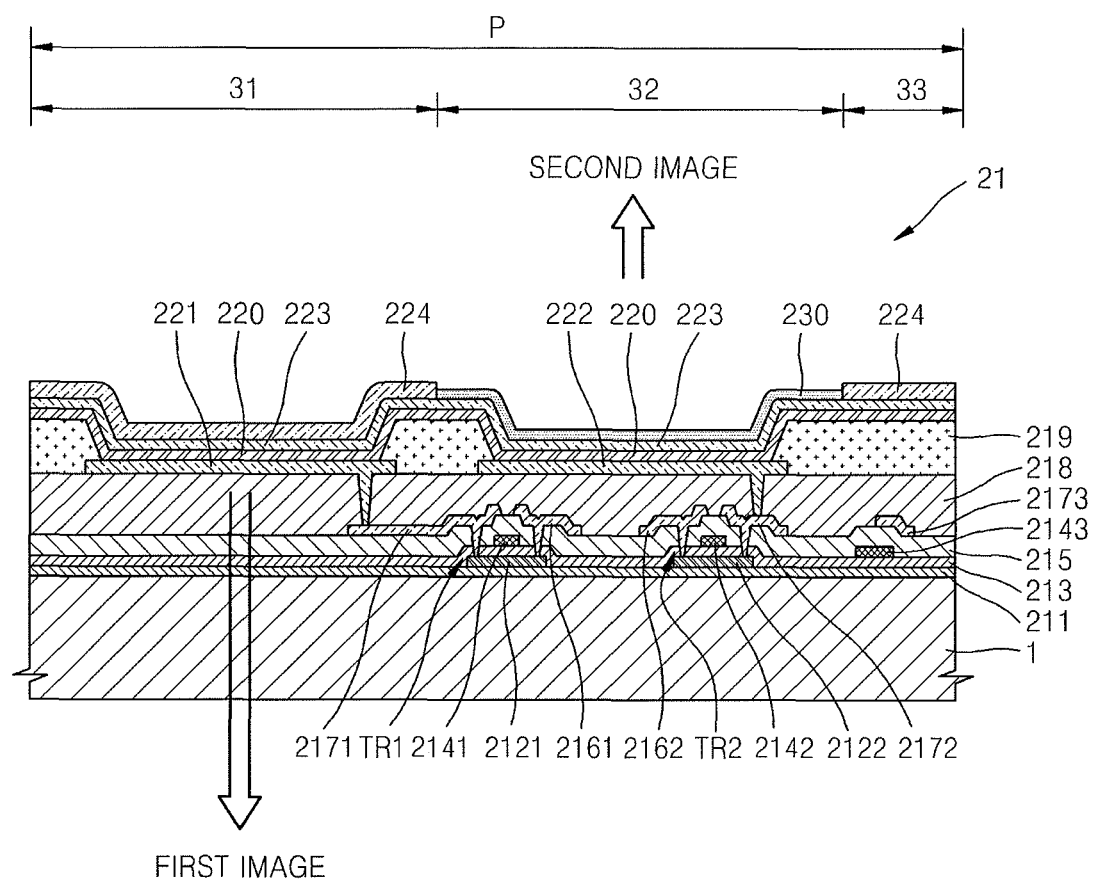
FIG. 7 illustrates a cross-sectional view along I-I of FIG. 3.

FIG. 7 illustrates a cross-sectional view along I-I of FIG. 3. Unlike the embodiment illustrated in FIG. 4, in the embodiment illustrated in FIG. 7, the auxiliary layer 230 may be excluded from the third region 33 and formed only in the second region 32. Accordingly, the fourth electrode 224 may be formed not only in the first region 31 but also in the third region 33. Because the fourth electrode 224 may be formed in the first region 31 and the third region 33, the fourth electrode 224 may overlap various wirings including the first wiring 2143 and the second wiring 2173, and accordingly, the first wiring 2143 and the second wiring 2173 may be hidden from view by a user who views the second image.

Figure 8:
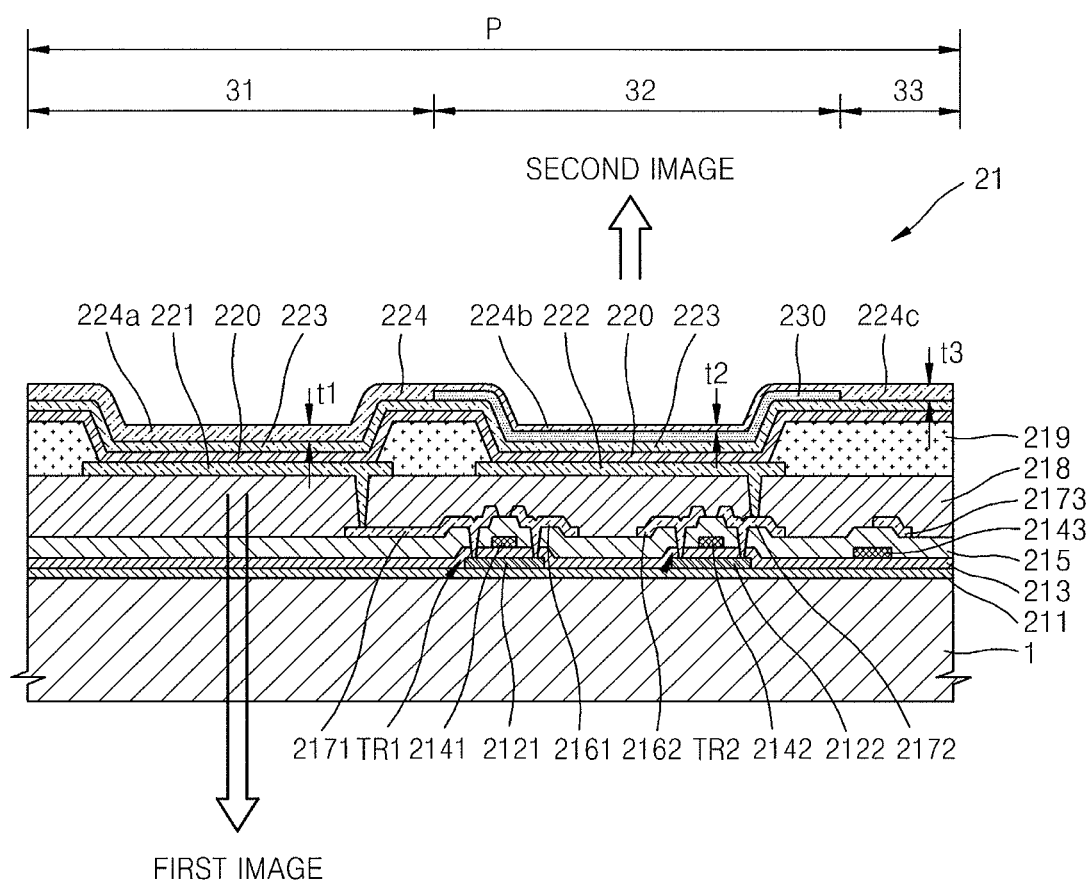
FIG. 8 illustrates a cross-sectional view along I-I of FIG. 3.

FIG. 8 illustrates a cross-sectional view along I-I of FIG. 3. Unlike the embodiment illustrated in FIG. 6, in the embodiment illustrated in FIG. 8, the auxiliary layer 230 may be excluded in the third region 33, and formed only in the second region 32. Accordingly, the fourth electrode 224 may be formed not only in the first region 31 but also in the third region 33. Even though the metal for forming the fourth electrode 224 may be somewhat deposited on the auxiliary layer 230, an amount thereof may be very small, and thus, the thickness t2 of the portion 224b of the fourth electrode 224 in the second region 32 may be much thinner than the thicknesses t1 and t3 of the portions 224a and 224c of the fourth electrode 224 in the first region 31 and the third region 33. The transmissivity of the second image does not have to be significantly lowered due to the portion 224b of the fourth electrode 224 in the second region 32.

Figure 9:
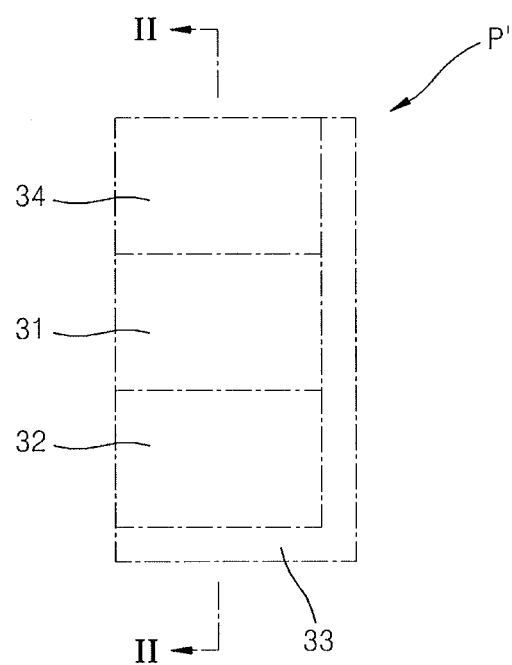
FIG. 9 illustrates a top view of a pixel in the organic emission part of the organic light-emitting display apparatus of FIG. 1 or 2.

FIG. 9 illustrates a top view of a pixel P' in the organic emission part 21 of the organic light-emitting display apparatus of FIG. 1 or 2. The pixel P' may include the first region 31, the second region 32, and a fourth region 34, which may be disposed to be adjacent to each other, and the third region 33 located around the first region 31, the second region 32, and the fourth region 34. The first region 31 may be a bottom emission region, the second region 32 may be a top emission region, and the fourth region 34 may be an external light transmission region through which external light transmits in the thickness direction of the organic light-emitting display apparatus. The third region 33 may be a region through which wirings connected to the first region 31 and the second region 32 pass. The third region 33 need not be disposed around the first region 31, the second region 32, and the fourth region 34 as shown in FIG. 9, and when, for example, the wirings are arranged to cross the first region 31, the second region 32, and/or the fourth region 34, the third region 33 does not have to exist as a separate region. The fourth region 34 may be provided, for example, per sub-pixel as shown in FIG. 9, and the fourth region 34 may be provided for each of sub-pixels forming a single unit pixel, e.g., each of red, green, and blue sub-pixels. The fourth region 34 may be provided for each of red, green, blue, and white sub-pixels.

Figure 10:
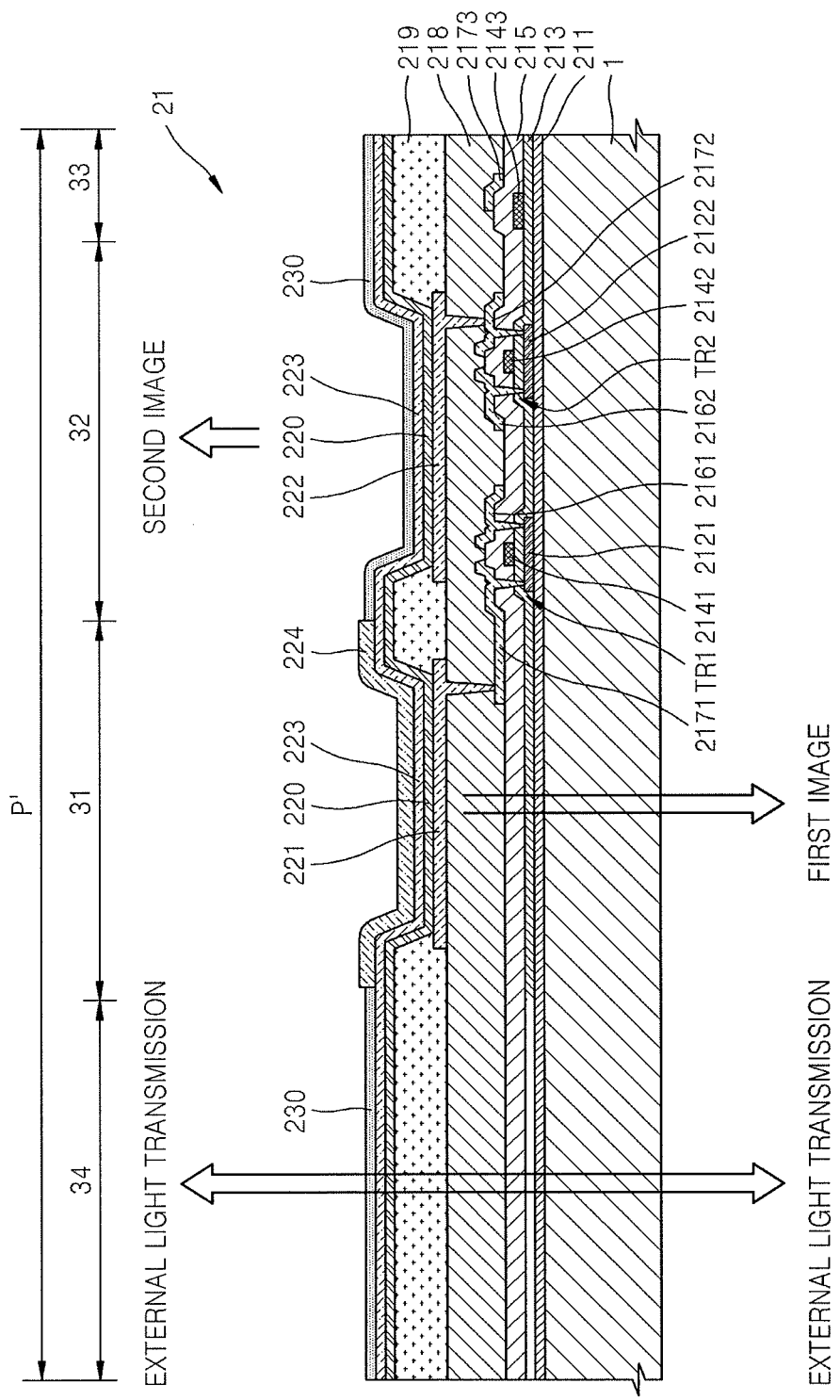
FIG. 10 illustrates a cross-sectional view along I-I of FIG. 9.

FIG. 10 illustrates a cross-sectional view along I-I of FIG. 9. In the embodiment illustrated in FIG. 10, the auxiliary layer 230 may be formed in the second region 32, the third region 33, and the fourth region 34 and may be excluded from the first region 31. The fourth electrode 224 may be patterned only in the first region 31 and contact the third electrode 223 without being formed in the second region 32, the third region 33, and the fourth region 34. Accordingly, the transmissivity of external light in the fourth region 34 through which the external light transmits need not be lowered due to the fourth electrode 224, and a transparent top- and bottom-emission display apparatus having an improved transmissivity of external light in the organic emission part 21 may be implemented.

Figure 11:
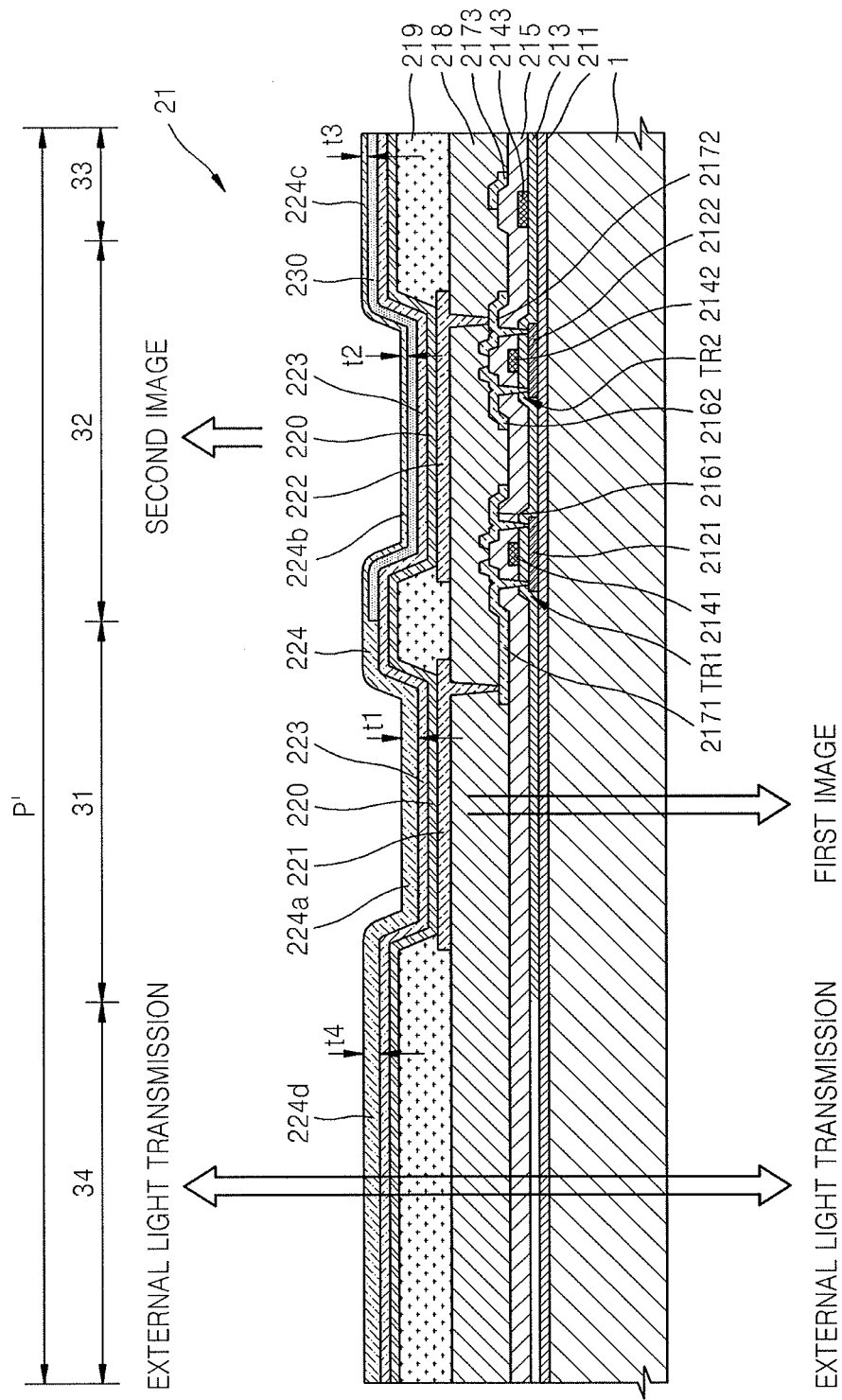
FIG. 11 illustrates a cross-sectional view along I-I of FIG. 9.

FIG. 11 illustrates a cross-sectional view along I-I of FIG. 9. Unlike the embodiment illustrated in FIG. 10, in the embodiment illustrated in FIG. 11, the fourth electrode 224 is formed as a thin film even on the auxiliary layer 230. Accordingly, the fourth electrode 224 is formed in the first region 31, the second region 32, the third region 33, and the fourth region 34. Even though the metal for forming the fourth electrode 224 is somewhat deposited on the auxiliary layer 230, an amount thereof may be very small, and thus, thicknesses t2, t3, and t4 of portions 224b, 224c, and 224d of the fourth electrode 224 in the second region 32, the third region 33, and the fourth region 34 may be much thinner than the thickness t1 of the portion 224a of the fourth electrode 224 in the first region 31. The transmissivity of the second image does not have to be significantly lowered due to the portion 224b of the fourth electrode 224 in the second region 32, and the transmissivity of external light does not have to be significantly lowered due to the portion 224d of the fourth electrode 224 in the fourth region 34. The auxiliary layer 230 need not be formed in the third region 33, and thus, like the embodiments illustrated in FIGS. 7 and 8, the fourth electrode 224 may also be formed in the third region 33.

Figure 12:
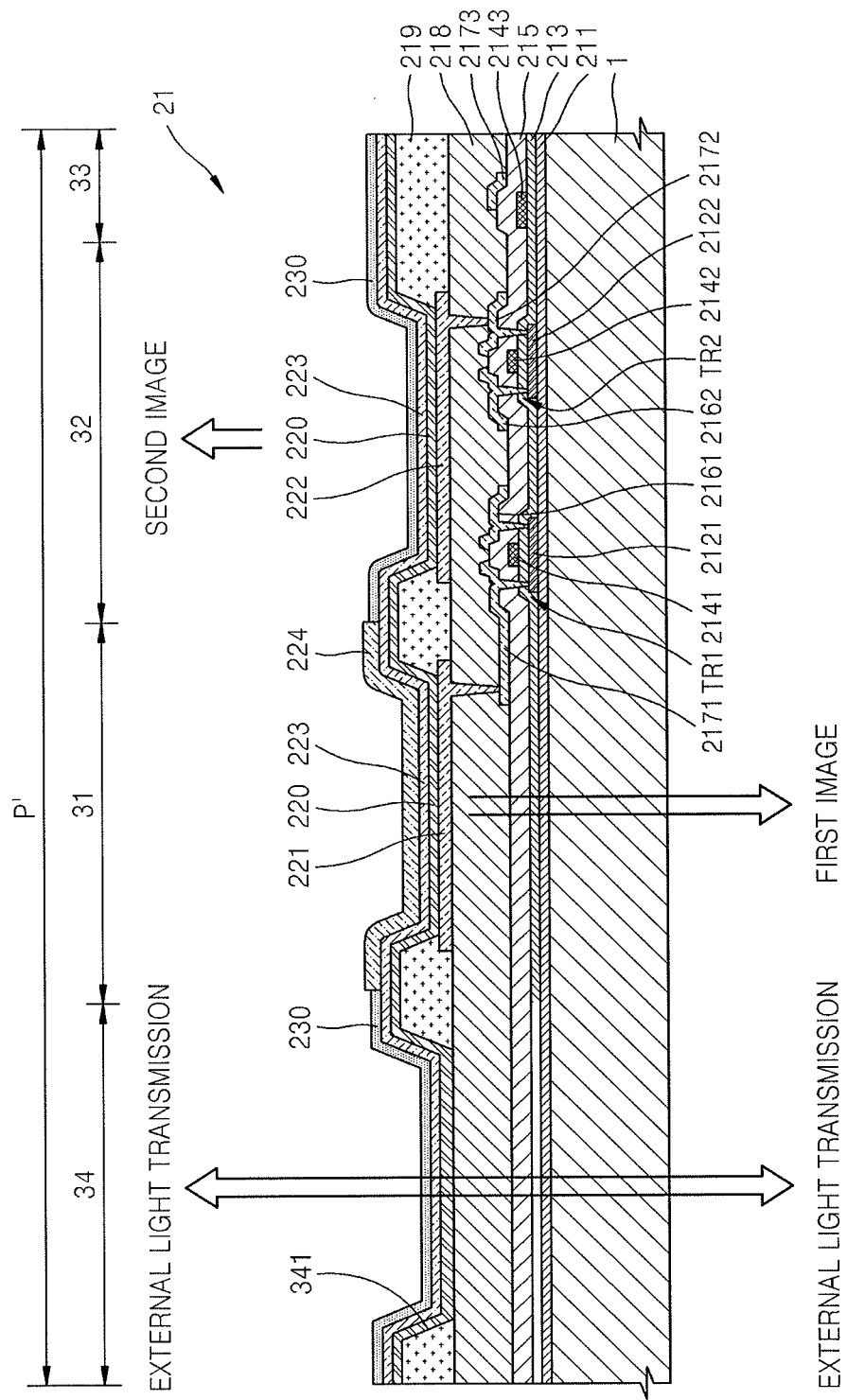
FIG. 12 illustrates a cross-sectional view along I-I of FIG. 9.

FIG. 12 illustrates a cross-sectional view along I-I of FIG. 9, which is a modified one of the embodiment illustrated in FIG. 10. Unlike the embodiment illustrated in FIG. 10, in the embodiment illustrated in FIG. 12, the second insulating layer 219 further includes a transmission window 341 in the fourth region 34. The transmission window 341 is formed by removing a portion of the second insulating layer 219. The transmission window 341 formed in the fourth region 34 may improve the transmissivity of external light. As an example, FIG. 12 shows that the transmission window 341 is formed only in the second insulating layer 219, the number and placement of the window may be varied, and a transmission window may be further formed in at least one of the first insulating layer 218, the interlayer insulating layer 215, the gate insulating layer 213, and the buffer layer 211. A transmission window structure as shown in FIG. 12 may also be applied to the embodiments illustrated in FIGS. 10 and 11.

Figure 13:
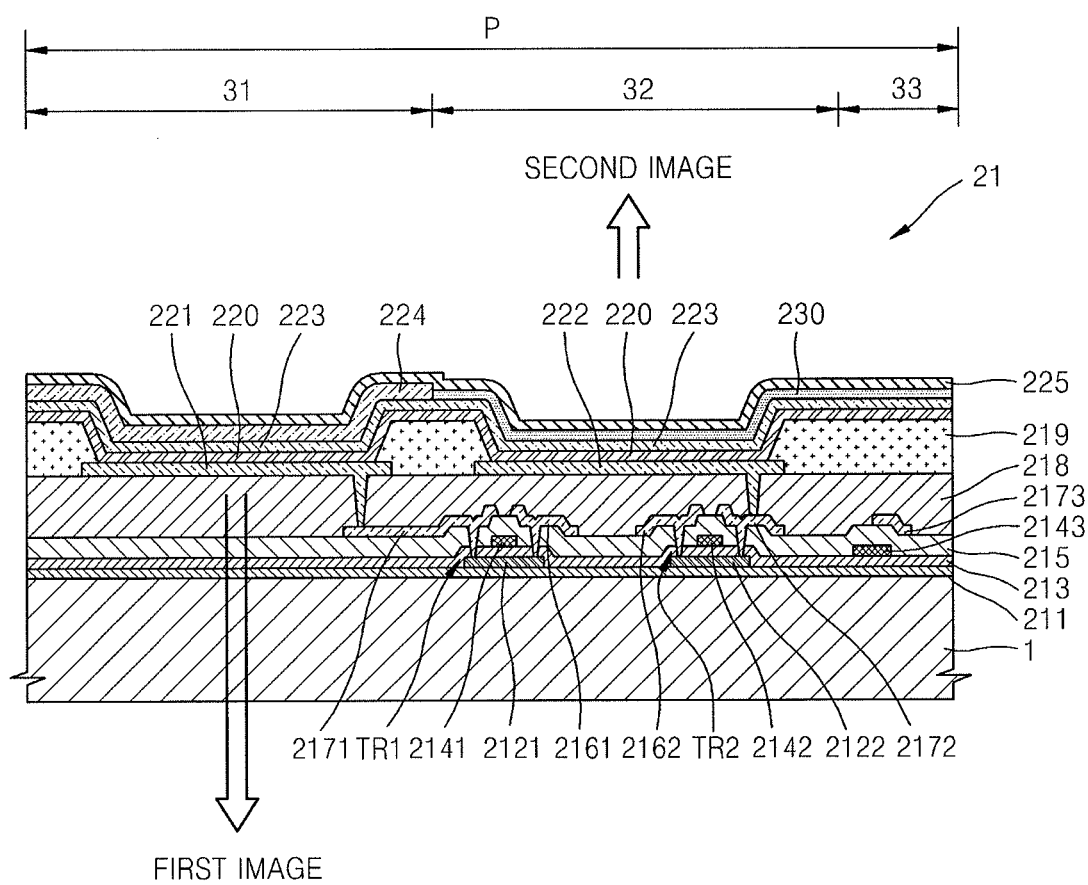
FIG. 13 illustrates a cross-sectional view of a modified example of FIG. 4.

FIG. 13 illustrates a cross-sectional view of a modified example of FIG. 4. In the embodiment illustrated in FIG. 13, a capping layer 225 is further formed as the uppermost layer of the organic emission part 21 to cover the fourth electrode 224 and the auxiliary layer 230. The capping layer 225 may include a material having a good light transmissivity. The capping layer 225 may include a halogenized metal containing LiF. The capping layer 225 may be applied to the embodiments illustrated in FIGS. 6 to 8 and 10 to 12 and all modified examples thereof.

Although it has been described herein that the third electrode 223, the auxiliary layer 230, and the fourth electrode 224 are sequentially formed, they need be performed sequentially. For example, the auxiliary layer 230 may be formed before forming the third electrode 223. In this case, when the third electrode 223 is formed to be relatively thick, the third electrode 223 may be formed to be thick in the first region 31 and to be thin in the second region 32, the third region 33, and/or the fourth region 34 in which the auxiliary layer 230 is formed so that the third electrode 223 covers the auxiliary layer 230. In this case, the fourth electrode 224 may include the same material as that of the third electrode 223 and formed as one body with the third electrode 223. The auxiliary layer 230 may have an electron injection/transport characteristic and/or a hole blocking characteristic. When the first electrode 221 and the second electrode 222 function as a cathode, for example, the auxiliary layer 230 may have a hole injection/transport characteristic. This embodiment may be applied to the embodiments illustrated in FIGS. 4, 6 to 8, and 10 to 13 and all modified examples thereof.

By way of summation and review, to simultaneously realize top emission and bottom emission, a cathode reflective electrode of a bottom emission part has been patterned on an organic emission layer. However, heretofore, it has been difficult to use a fine metal mask frequently for such patterning. As described herein, a fourth electrode including a metal may be formed by patterning without a separate patterning mask, thereby greatly simplifying and improving the patterning process. The fourth electrode may be excluded from a fourth region through external light transmission or may be formed with a minimum thickness, thereby improving the transmissivity of the whole panel on which the electrode is formed.

The fourth electrode may also reduce a wiring resistance of a third electrode. The present embodiments may be readily applied to large-sized display apparatuses. These general and specific embodiments may be implemented by using a system, a method, a computer program, or a combination of the system, the method, and the computer program.

The structures described herein may be more usefully utilized by being applied to large-region organic light-emitting display apparatuses. For example, when a large-region organic light-emitting display apparatus, specifically, an upper electrode, is formed, because it may be difficult to apply a patterning process using a fine metal mask, patterning of a reflective electrode in a first region that is a bottom emission region is difficult. However, when a structure is used as described herein, an open mask may be used instead of the fine metal mask to pattern the reflective electrode in the bottom emission region, a process may be more usefully applied.

Although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light-emitting display apparatus, comprising:
    a plurality of pixels, each pixel including a first region that emits light in a first direction and a second region that emits light in a second direction that is opposite to the first direction;
    a plurality of first electrodes respectively located in the first region of each of the plurality of pixels;
    a plurality of second electrodes respectively located in the second region of each of the plurality of pixels;
    an intermediate layer on the plurality of first electrodes and the plurality of second electrodes and including an organic emission layer;
    a third electrode on the intermediate layer and disposed in the first region and the second region;
    an auxiliary layer in the second region and not disposed in the first region; and
    a fourth electrode in the first region and contacting the third electrode,
    wherein the auxiliary layer and the fourth electrode are on a same side of the third electrode.

2. The organic light-emitting display apparatus as claimed in claim 1, wherein the fourth electrode is not in the second region.

3. The organic light-emitting display apparatus as claimed in claim 1, wherein the fourth electrode is also in the second region, and a thickness of a portion of the fourth electrode in the second region is thinner than that of a portion of the fourth electrode in the first region.

4. The organic light-emitting display apparatus as claimed in claim 3, wherein the portion of the fourth electrode in the second region is on the auxiliary layer.

5. The organic light-emitting display apparatus as claimed in claim 1, wherein each of the plurality of pixels further includes a third region in which at least a wiring electrically connected to at least one of the first electrode and the second electrode is located,
    the auxiliary layer is not in the third region, and
    the fourth electrode is also in the third region.

6. The organic light-emitting display apparatus as claimed in claim 1, wherein each of the plurality of pixels further includes a third region in which at least a wiring electrically connected to at least one of the first electrode and the second electrode is located, and
    the auxiliary layer is also in the third region.

7. The organic light-emitting display apparatus as claimed in claim 6, wherein the fourth electrode is also in the second region and the third region, and thicknesses of portions of the fourth electrode in the second region and the third region are thinner than that of a portion of the fourth electrode in the first region.

8. The organic light-emitting display apparatus as claimed in claim 7, wherein the portions of the fourth electrode in the second region and the third region are on the auxiliary layer.

9. The organic light-emitting display apparatus as claimed in claim 1, wherein each of the plurality of pixels further includes a fourth region through which external light transmits in the thickness direction of the organic light-emitting display apparatus, and
    the auxiliary layer is also in the fourth region.

10. The organic light-emitting display apparatus as claimed in claim 9, wherein the fourth electrode is not in the fourth region.

11. The organic light-emitting display apparatus as claimed in claim 9, wherein the fourth electrode is also in the second region and the fourth region, and thicknesses of portions of the fourth electrode in the second region and the fourth region are thinner than that of the portion of the fourth electrode in the first region.

12. The organic light-emitting display apparatus as claimed in claim 11, wherein the portions of the fourth electrode in the second region and the fourth region are on the auxiliary layer.

13. The organic light-emitting display apparatus as claimed in claim 1, wherein a thickness of the fourth electrode is thicker than that of the third electrode.

14. The organic light-emitting display apparatus as claimed in claim 1, wherein an adhesive force of the fourth electrode to the third electrode is stronger than that to the auxiliary layer.

15. The organic light-emitting display apparatus as claimed in claim 1, wherein the auxiliary layer includes N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA[4,4,4-tris(3-methylphenylphenylamino)triphenylamine], α-NPD(N,N'-bis(1-naphthyl)-N,N'-diphenyl[1,1'-biphenyl]-4,4'-diamine), or TPD[4,4'-Bis[N-(3-methylphenyl)-N-phenylamino]biphenyl].

16. The organic light-emitting display apparatus as claimed in claim 1, wherein the fourth electrode includes magnesium (Mg).

17. A method of manufacturing an organic light-emitting display apparatus, the method comprising:
    defining a plurality of pixels, each pixel including a first region that emits light in a first direction and a second region that emits light in a second direction that is opposite to the first direction;

forming a plurality of first electrodes respectively located in the first region of each of the plurality of pixels;

forming a plurality of second electrodes respectively located in the second region of each of the plurality of pixels;

forming an intermediate layer that is on the plurality of first electrodes and the plurality of second electrodes and includes an organic emission layer;

forming a third electrode on the intermediate layer in the first region and the second region by depositing a first metal on the intermediate layer;

forming an auxiliary layer on the third electrode in the second region and not to be in the first region; and forming a fourth electrode on the third electrode in the first region and contacting the third electrode by depositing a second metal on the third electrode, wherein the auxiliary layer and the fourth electrode are on a same side of the third electrode.

18. The method as claimed in claim 17, wherein forming the fourth electrode includes depositing the second metal in the first region and the second region simultaneously so that the fourth electrode is not in the second region.

19. The method as claimed in claim 17, wherein forming the fourth electrode includes depositing the second metal in the first region and the second region simultaneously so that the fourth electrode is also in the second region, and a thickness of a portion of the fourth electrode in the second region is thinner than that of a portion of the fourth electrode in the first region.

20. The method as claimed in claim 19, wherein forming the fourth electrode includes forming the fourth electrode on the auxiliary layer at least in the second region.

21. The method as claimed in claim 17, wherein each of the plurality of pixels further includes a third region in which at least a wiring electrically connected to at least one of the first electrode and the second electrode is located, forming the auxiliary layer includes forming the auxiliary layer not to be in the third region, and forming the fourth electrode includes depositing the second metal in the first region and the third region simultaneously so that the fourth electrode is in the third region.

22. The method as claimed in claim 17, wherein each of the plurality of pixels further includes a third region in which at least a wiring electrically connected to at least one of the first electrode and the second electrode is located, and forming the auxiliary layer includes forming the auxiliary layer in the third region.

23. The method as claimed in claim 22, wherein forming the fourth electrode includes depositing the second metal in the first region to the third region simultaneously so that the fourth electrode is also in the second region and the third region, and thicknesses of portions of the fourth electrode in the second region and the third region are thinner than that of the portion of the fourth electrode in the first region.

24. The method as claimed in claim 23, wherein forming the fourth electrode includes forming the fourth electrode on the auxiliary layer at least in the second region and the third region.

25. The method as claimed in claim 17, wherein each of the plurality of pixels further includes a fourth region through which external light transmits in the thickness direction of the organic light-emitting display apparatus, and forming the auxiliary layer includes forming the auxiliary layer in the fourth region.

26. The method as claimed in claim 25, wherein forming the fourth electrode includes depositing the second metal in the first region, the second region, and the fourth region simultaneously so that the fourth electrode is not in the fourth region.

27. The method as claimed in claim 25, wherein forming the fourth electrode includes depositing the second metal in the first region, the second region, and the fourth region simultaneously so that the fourth electrode is also in the second region and the fourth region, and thicknesses of portions of the fourth electrode in the second region and the fourth region are thinner than that of the portion of the fourth electrode in the first region.

28. The method as claimed in claim 27, wherein forming the fourth electrode includes forming the fourth electrode on the auxiliary layer at least in the second region and the fourth region.

29. The method as claimed in claim 17, wherein a thickness of the fourth electrode is thicker than that of the third electrode.

30. The method as claimed in claim 17, wherein an adhesive force of the fourth electrode to the third electrode is stronger than that to the auxiliary layer.

31. The method as claimed in claim 17, wherein the auxiliary layer includes N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, m-MTDATA[4,4,4-tris(3-methylphenylphenylamino)triphenylamine], α-NPD(N,N'-bis(1-naphthyl)-N,N'-diphenyl[1,1'-biphenyl]-4,4'-diamine), or TPD[4,4'-Bis[N-(3-methylphenyl)-N-phenylamino]biphenyl].

32. The method as claimed in claim 17, wherein the fourth electrode includes magnesium (Mg).

33. The method as claimed in claim 17, wherein the first and second electrodes include the same metal.

* * * * *